(12) United States Patent
Armitage et al.

(10) Patent No.: US 6,429,721 B1
(45) Date of Patent: Aug. 6, 2002

(54) MIXER WITH STEPPED GAIN AND CONSTANT COMMON MODE DC OUTPUT BIAS VOLTAGE

(75) Inventors: Philip J. Armitage, Oldham; Brian E. Merrigan, Urmston, both of (GB)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/033,158

(22) Filed: Oct. 25, 2001

(51) Int. Cl.[7] .............................. G06F 7/44; G06G 7/16
(52) U.S. Cl. ...................................................... 327/359
(58) Field of Search ................................ 327/355–362; 330/252, 261; 455/326, 189, 209

(56) References Cited

U.S. PATENT DOCUMENTS

| | | | |
|---|---|---|---|
| 5,859,559 A | * | 1/1999 | Hong et al. ................. 327/359 |
| 6,229,374 B1 | * | 5/2001 | Tammone, Jr. .............. 327/350 |
| 6,242,963 B1 | * | 6/2001 | Su et al. ...................... 327/359 |
| 6,300,832 B1 | * | 10/2001 | Okazaki ....................... 330/254 |
| 6,342,804 B1 | * | 1/2002 | Havens et al. .............. 327/357 |

OTHER PUBLICATIONS

Phillip E. Allen, Douglas R. Holberg, "CMOS Analog Circuit Design," Saunders College Publishing/HBJ, Orlando, 1987, pp 605–607.

* cited by examiner

Primary Examiner—My-Trang Nu Ton
(74) Attorney, Agent, or Firm—Westman, Champlin and Kelly

(57) ABSTRACT

An mixer includes a differential signal input, a differential local oscillator input, a gain control input and a differential signal output. The mixer has a stepped signal gain from the differential signal input to the differential signal output which is variable from a first gain to a second, different gain as a function of the gain control input and has a substantially constant DC common mode output bias voltage at the differential signal output.

20 Claims, 2 Drawing Sheets

US 6,429,721 B1

MIXER WITH STEPPED GAIN AND CONSTANT COMMON MODE DC OUTPUT BIAS VOLTAGE

FIELD OF THE INVENTION

The present invention relates to a mixer for mixing an input signal with a tuned local oscillator frequency. In particular, the present invention relates to an RF mixer having a variable gain.

BACKGROUND OF THE INVENTION

Communication receivers are used in a variety of applications, such as in satellite tuners. One example of a satellite tuner includes a mixer for mixing an amplified RF input signal with a tuned local oscillator frequency. The RF input signal is typically a differential voltage. Various types of RF mixers have been used.

One traditional type of RF mixer is known as a "Gilbert Mixer". One representation of a Gilbert mixer uses an NMOS differential transistor pair as a transconductor to convert the differential voltage RF input signal to a differential current, which is then mixed with a differential local oscillator signal through a pair of cross-coupled differential transistor pairs. The resulting currents at the outputs of the cross-coupled differential transistor pairs can be coupled to a positive voltage supply rail through load resistors to generate a differential voltage output signal.

As supply rail voltage levels continue to reduce with advances in semiconductor technology, the voltage drop requirements across the mixing cell restricts the available output voltage swing when the output voltage swing is developed across load resistors to VDD. In technologies having low supply voltages, the head room constraints can be improved through the use of modified mixing cells using current folding techniques. The currents developed at the outputs of the cross-coupled differential transistor pairs are mirrored to a pair of PMOS output transistors and then coupled to a negative voltage supply rail through the load resistors to produce a differential voltage output. In this type of mixer, the voltage drop across the transconductors no longer constrains the head room available for the output voltage swing.

Folding the current through a current mirror also allows the common mode DC output voltage and the circuit gain to be set to desired levels. The common mode DC output voltage is defined by the values of the load resistors, the level of current supplied to the transconductors in the mixing cell and the ratio of the areas of the transistors that form the current mirror. For each current output of the transconductors, the current mirror has an input reference transistor and an output transistor. Thus by designing the input reference transistors and the output transistors with certain area ratios, a desired fixed circuit gain can be achieved. For example, if the areas of the output transistors are a third less than the areas of the reference transistors, then the AC signal current and the DC current in each load resistor will attenuated by a third. In addition, since the DC current in each load resistor is attenuated by a third, the common mode DC output voltage is also reduced by a third as compared to the common mode output voltage that would be present if the reference transistors and output transistors in the current mirror had equal areas.

In certain applications, it is desirable to provide the overall tuning system with a variable gain. Since the gain through an RF mixer stage is traditionally fixed, additional circuit stages are required for providing the variable gain. Improved mixing circuits are therefore desired that are capable of contributing to an overall system variable gain requirement while maintaining a substantially DC common mode voltage at the output of the mixer.

SUMMARY OF THE INVENTION

One embodiment of the present invention is directed to an mixer which includes a differential signal input, a differential local oscillator input, a gain control input and a differential signal output. The mixer has a stepped signal gain from the differential signal input to the differential signal output which is variable from a first gain to a second, different gain as a function of the gain control input and has a substantially constant DC common mode output bias voltage at the differential signal output.

Another embodiment of the present invention is directed to an mixer which includes a differential voltage signal input, a differential voltage local oscillator input, a gain control input and a differential voltage signal output. First and second load resistors are coupled to respective terminals of the differential voltage signal output. An input stage mixes the differential voltage signal input with the differential voltage local oscillator input to produce a mixed differential current. A current mirror mirrors the mixed differential current into the first and second load resistors. A gain switching circuit switches current gain in the current mirror as a function of the gain control input while maintaining a common-mode DC current in the first and second load resistors substantially constant.

Another embodiment of the present invention is directed to a method of mixing a differential input signal with a differential local oscillator signal with gain. The method includes mixing a differential input signal with a differential local oscillator signal to produce a mixed differential current; mirroring the mixed differential current into first and second load resistors through a current mirror; switching signal gain through the current mirror while maintaining a common-mode DC current in the load resistors substantially constant.

DETAILED DESCRIPTION OF ILLUSTRATIVE EMBODIMENTS

Figure 1:
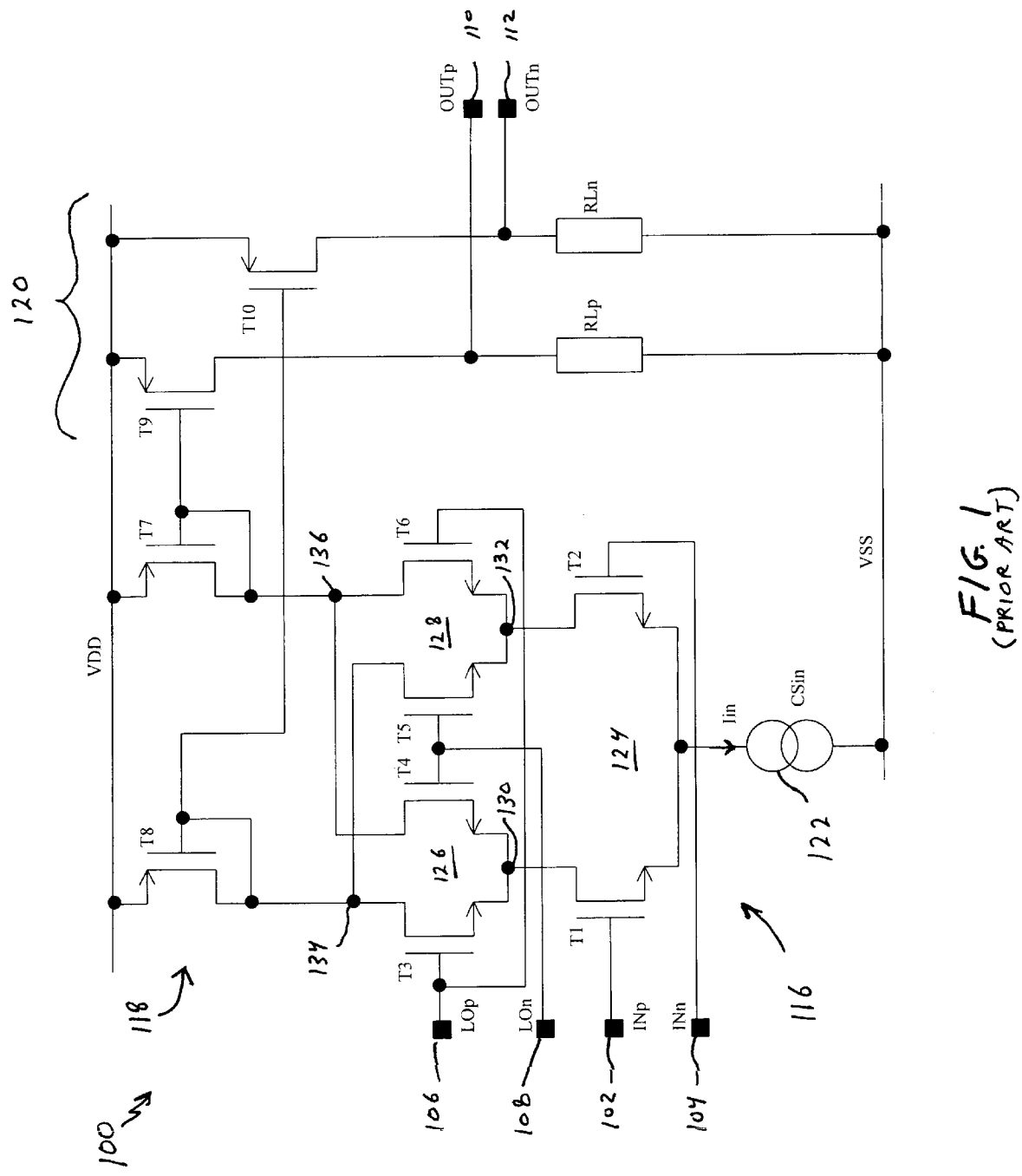
FIG. 1 is a schematic diagram illustrating a Gilbert mixer with current folding according to the prior art.

FIG. 1 is a schematic diagram illustrating a Gilbert mixer 100 with current folding according to the prior art. Mixer 100 is electrically coupled between positive voltage supply rail VDD and negative voltage supply rail VSS. Mixer 100 includes differential voltage signal inputs INp and INn (labeled 102 and 104), differential voltage local oscillator (LO) inputs LOp and LOn (labeled 106 and 108), and differential voltage signal outputs OUTp and OUTn (labeled 110 and 112). Mixer 100 has an input stage 116, a current mirror circuit 118 and an output stage 120.

Mixer input stage 116 includes an input tail current source CSin (labeled 122), a transconductor 124 and cross-coupled transconductors 126 and 128. Tail current source 122 is coupled between transconductor 124 and negative voltage supply rail VSS for supplying a DC tail current Iin to transconductor 124.

Transconductors 124, 126 and 128 form a Gilbert mixer. In this example, the Gilbert mixer is formed of NMOS transistors T1–T6. Transistors T1 and T2 are coupled together to form a differential transconductor and have gates (or "current control terminals") coupled to differential signal inputs INp and INn, respectively, sources coupled to tail current source CSin and drains which define differential current outputs 130 and 132. Transistors Ti and T2 convert the differential input voltage on inputs INp and INn to a differential signal current across current outputs 130 and 132. The differential signal current has a DC level that is defined by the tail current CSin.

Transconductor 126 is coupled in series with current output node 130 and includes transistors T3 and T4. Transistors T3 and T4 have gates coupled to local oscillator inputs LOp and LOn, respectively, sources coupled to current output node 130 and drains which define a pair of differential mixed current output nodes 134 and 136, respectively. Transistors T3 and T4 steer the signal current at output node 130 through mixed current output nodes 134 and 136 as a function of the relative voltages on local oscillator inputs LOp and LOn.

Similarly, transconductor 128 is coupled in series with current output node 132 and includes transistors T5 and T6. Transistors T5 and T6 have gates coupled to local oscillator inputs LOn and LOp, respectively, sources coupled to current output node 132 and drains coupled to mixed current output nodes 134 and 136, respectively. Transistors T5 and T6 steer the signal current at output node 132 through mixed current output nodes 134 and 136 as a function of the relative voltages on local oscillator inputs LOn and LOp. Transistors T5 and T6 are therefore cross-coupled with transistors T3 and T4.

In one configuration of a Gilbert mixer, mixed current output nodes 134 and 136 would be coupled directly to voltage supply rail VDD through respective load resistors for converting the currents on nodes 134 and 136 to differential output voltages. However, with the configuration shown in FIG. 1, the currents on nodes 134 and 136 are mirrored into load resistors RLp and RLn through current mirror circuit 118. Current mirror circuit 118 includes a first current mirror formed by PMOS reference transistor T8 and PMOS output transistor T10 and a second current mirror formed by PMOS reference transistor T7 and PMOS output transistors T9.

In the first current mirror, reference transistor T8 is coupled to function as a diode and has a gate and drain coupled to mixed current output node 134 and a source coupled to voltage supply rail VDD. Output transistor T10 has a gate coupled to the gate of reference transistor T8, a drain coupled to load resistor RLn and output OUTn and a source coupled to voltage supply rail VDD.

In the second current mirror, reference transistor T7 is coupled to function as a diode and has a gate and drain coupled to mixed current output node 136 and a source coupled to voltage supply VDD. Output transistor T9 has a gate coupled to the gate of reference transistor T7, a drain coupled to load resistor RLp and output OUTp and a source coupled to voltage supply rail VDD.

Output stage 120 includes the output transistors T9 and T10 of current mirror circuit 118 and load resistors RLp and RLn. Output transistor T9 is coupled in series with load resistor RLp, between voltage supply rails VDD and VSS. Output transistor T10 is coupled in series with load resistor RLn, between voltage supply rails VDD and VSS. Differential signal outputs OUTp and OUTn are coupled to the nodes between output transistor T9 and load resistor RLp and between output transistor T10 and load resistor RLn, respectively.

During operation, the current mirror formed by transistors T8 and T10 mirrors the current on mixed current output node 134 (at the drain of transistor T8) onto the drain of transistor T10 and thus into load resistor RLn. Similarly, the current mirror formed by transistors T7 and T9 mirrors the current on mixed current output node 136 (at the drain of transistor T7) onto the drain of transistor T9 and thus into load resistor RLp. Load resistors RLp and RLn convert the drain currents in transistors T9 and T10 into a differential output voltage signal on outputs OUTp and OUTn. The differential output voltage signal therefore reflects the mixed differential output currents developed on nodes 134 and 136. A desired gain can be achieved by fabricating output transistors T9 and T10 with different gate areas than reference transistors T7 and T8.

The input transconductance is defined by the device geometries of transistors T1 and T2 and the tail current Iin. These values, along with the device geometries of transistors T3, T4, T5 and T6, the geometries and ratios of transistors T7–T10, and the load resistor values RLp and RLn define the DC and small signal operation of mixer 100, and are selected to give a desired performance. In addition, transistors T1–T2, T3–T6 and T7–T10 and resistors RLp and RLn are matched with one another.

Signal outputs OUTp and OUTn sit at a common mode DC voltage that is defined by the values of resistors RLp and RLn, the input tail current Iin and the ratio of the effective gate areas of reference transistors T7 and T8 and to the effective gate areas of their respective output transistors T9 and T10. The ratio of effective gate areas can be set by fabricating reference transistor T7 and T8 with different gate lengths and/or widths than output transistors T9 and T10 or by implementing each of the transistors T7–T10 with arrays multiple transistors in parallel with one another, with transistors T7 and T8 having a different multiple ("M") factor than transistors T9 and T10, where the "M" factor indicates the number of parallel-connected transistors.

For example, if the gate lengths and widths of transistors T7–T10 are all the same, but transistors T7 and T8 have an "M" factor of 9 and transistors T9 and T10 have an "M" factor of 3, then the DC current in each load resistor RLp and RLn will be attenuated from the DC currents on nodes 134 and 136 by a third. In this example, the DC currents in load resistors RLp and RLn is (Iin/2)*(3/9), where the term Iin/2 reflects the division of DC current by transconductor 124 and the term 3/9 reflects the ratio of "M" factors of transistors T9 and T10 relative to transistors T7 and T8. The AC signal current in each load resistor RLp and RLn will therefore also be attenuated by a third.

Folding the current through current mirror circuit 118 therefore gives the advantage of being able to ratio the current presented to load resistors RLp and RLn relative to the input tail current Iin, which an be used to set the output DC bias voltage and the circuit gain of mixer 100. However, the circuit gain of mixer 100 remains fixed. Therefore, mixer 100 is not capable of contributing any variability in the overall gain requirements of the system in which the mixer is used.

Figure 2:
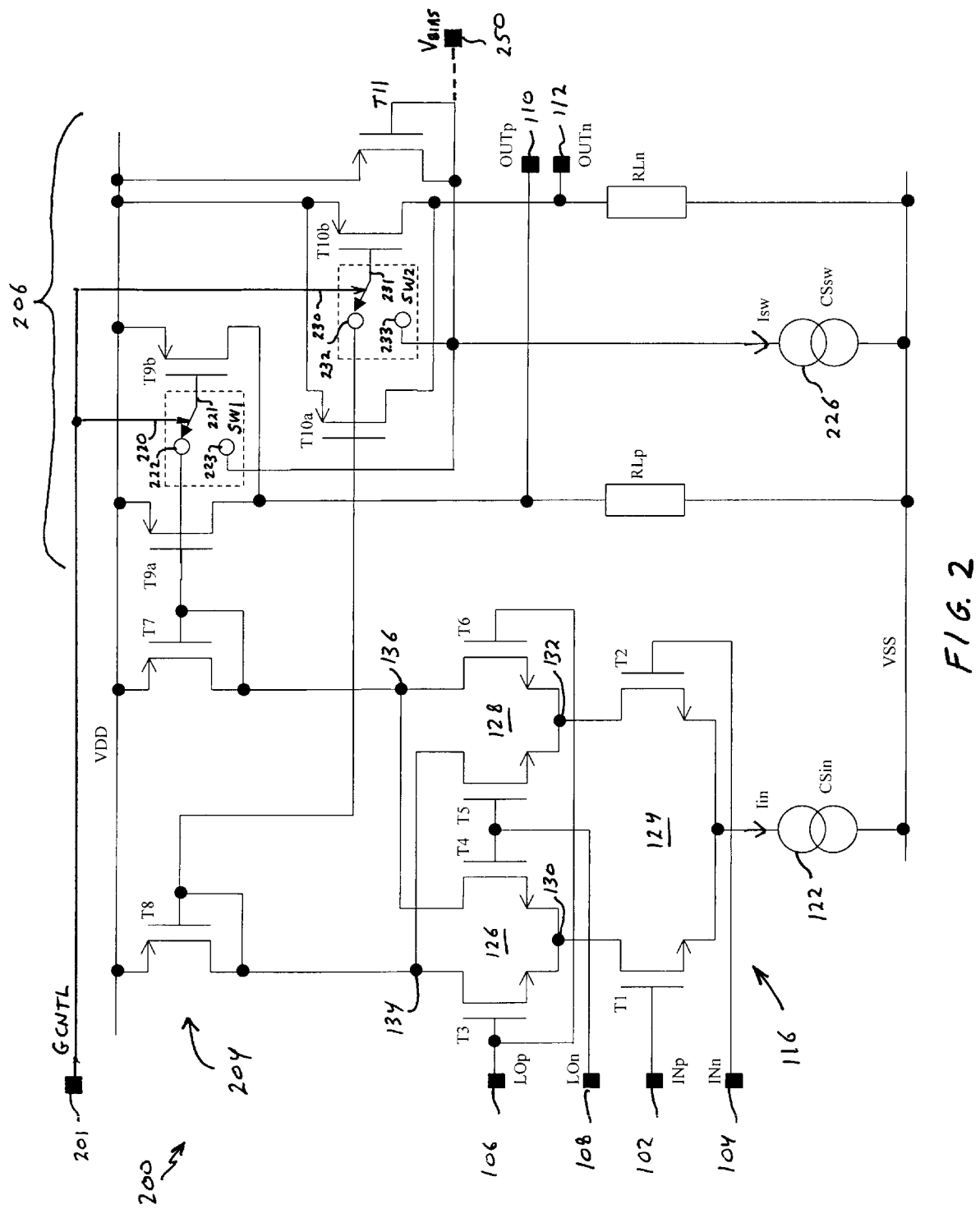
FIG. 2 is schematic diagram of an mixer having a switched stepped gain function according to one embodiment of the present invention.

FIG. 2 is schematic diagram of a mixer 200 having a switched stepped gain function according to one embodiment of the present invention. As described in more detail below, mixer 200 provides a variable gain while maintaining a substantially constant DC common mode output voltage. Mixer 200 has the same basic circuit elements as mixer 100 shown in FIG. 1, but also has additional circuit elements for implementing the variable gain function. Therefore, the same reference numerals are used for the same or similar elements.

Mixer 200 is coupled between voltage supply rails VDD and VSS and includes differential signal inputs INp and INn, differential local oscillator inputs LOp and LOn, a gain control input GCNTL (labeled 201), differential signal outputs OUTp and OUTn, an input mixer stage 116, a current mirror circuit 204 and an output stage 206. Similar to mixer 100, input mixer stage 116 includes tail current source CSin and NMOS transistors T1–T6.

Current mirror circuit 204 includes reference transistors T7 and T8 and output transistors T9 and T10, which have been split into separate transistors (or arrays of parallel transistors) T9a, T9b and T10a, T10b. Transistors T9b and T10b are switched transistors which are selectively coupled in parallel with current mirror output transistors T9a and T10a, respectively. Transistors T9a and T9b are coupled in series between voltage supply terminal VDD and load resistor RLp within output stage 206. Similarly, transistors T10a and T10b are coupled in series between voltage supply terminal VDD and load resistor RLn within output stage 206. The gate of transistor T9a is coupled to the gate of reference transistor T7 such that the drain of transistor T9a forms an output leg of current mirror circuit 204. Similarly, the gate of transistor T10a is coupled to the gate of reference transistor T8 such that the drain of transistor T10a forms another output leg of current mirror circuit 204.

Switch SW1 selectively couples the gate of switched gain transistor T9b either to the gate of transistor T9a or to the gate of a supplemental reference transistor T11. Switch SW1 has a switch control input 220 coupled to gain control input GCNTL, a signal input 221 coupled to the gate of transistor T9b, an output 222 coupled to the gates of transistors T7 and T9a, and an output 223 coupled to the gate and drain of supplemental reference transistor T11. Supplemental reference transistor T11 has a source coupled to voltage supply rail VDD. When switch SW1 connects signal input 221 to signal output 222, switched gain transistor T9b is coupled in parallel with output transistor T9a within one of the output legs of current mirror circuit 204. The current mirrored onto the drain of switched gain transistor T9b from mixed current output node 134 is therefore added to the drain current of output transistor T9a and fed to load resistor RLp. When switch SW1 connects signal input 221 to signal output 224, switched gain transistor T9b is coupled to form a supplemental current mirror with supplemental reference transistor T11. The supplemental current mirror mirrors the drain current from transistor T11 onto the drain of transistor T9b and thus into load resistor RLp. The drain current in transistor T11 is supplied by a supplemental current source CSsw (labeled 226), which is coupled in series between transistor T11 and negative voltage supply rail VSS.

Similarly, switch SW2 selectively couples the gate of switched gain transistor T10b either to the gate of transistor T10a or to the gate of supplemental reference transistor T11. Switch SW2 has a switch control input 230 coupled to gain control input GCNTL, a signal input 231 coupled to the gate of transistor T10b, an output 232 coupled to the gates of transistors T8 and T10a, and an output 233 coupled to the gate and drain of supplemental reference transistor T11. When switch SW2 connects signal input 231 to signal output 232, switched gain transistor T10b is coupled in parallel with output transistor T10a within the other of the output legs of current mirror circuit 204. The current mirrored onto the drain of switched gain transistor T10b from mixed current output node 136 is therefore added to the drain current of output transistor T10a and fed to load resistor RLn. When switch SW2 connects signal input 231 to signal output 233, switched gain transistor T10b is coupled to form a supplemental current mirror with supplemental reference transistor T11. This supplemental current mirror mirrors the drain current from transistor T11 onto the drain of transistor T10b and thus into load resistor RLn. The state of gain control input GNTL determines whether switches SW1 and SW2 connect the gates of switched gain transistors T9b and T10b to the gates of transistors T9a and T10a or to the gate and drain of transistor T11. Switches SW1 and SW2 can be implemented with simple NMOS devices or full CMOS devices, depending on the desired performance.

With the circuit configuration shown in FIG. 2, mixer 200 can be operated in a "high gain" mode or a "low gain" mode. The high gain and low gain modes can be explained with an example similar to that discussed above with respect to FIG. 1. In this example, current mirror reference transistors T7 and T8 have an "M" factor of 9, indicating that each transistor is formed of an array of nine transistors connected in parallel with one another, with each transistor having the same length and width. Transistors T9a, T9b, T10 and T10b also have the same length and width as transistors T7 and T8. However, output transistors T9a and T10a have "M" factors of 1, and switched gain transistors T9b and T10b have "M" factors or 2, indicating that transistors T9a and T9b are single transistors and transistors T10a and T10b are each arrays of two transistors connected together in parallel.

In the high gain mode, switches SW1 and SW2 connect switched gain transistors T9b and T10b in the signal path, in parallel Pa with output transistors T9a and T10a, respectively, giving an effective gate area ratio of 9/3. The resulting AC signal and DC current gain from mixed current output nodes 134 and 136 to load resistors RLp and RLn is therefore one-third (⅓).

In the low gain mode, switches SW1 and SW2 selectively decouple switched gain transistors T9b and T10b out of the signal path such that they are no longer in parallel with output transistors T9a and T10a, respectively. The AC signal gain from mixed current output nodes 134 and 136 to load resistors RLp and RLn is one-ninth. The resulting gain variation from the high gain mode to the low gain mode in this example would therefore be 3:1 or 9.5 dB.

However the resulting DC current provided at the drains of output transistors T9a and T10a to load resistors RLp and RLn is also reduced to one-ninth in the low gain mode. In order to prevent the common mode DC output voltage at outputs OUTp and OUTn from varying with the AC signal gain, the supplemental current mirror formed by supplemental current source CSsw, supplemental reference transistor T11 and switched gain transistors T9b and T10b provide supplemental current to load resistors RLp and RLn in the low gain mode to maintain the DC current level through the load resistors substantially constant.

In the above example, the common mode DC output voltage at outputs OUTp and OUTn will be unaffected by the gain switch as long as supplemental current source 226 provides a DC current, Isw, that is substantially equal to (Iin/2)*(2/9). This current is equivalent to the current provided to load resistors RLp and RLn by switched gain transistors T9b and T10b when these transistors are coupled in the signal path, in parallel with output transistors T9a and T10a. By switching the gates of transistors T9b and T10b to connect with the gate of transistor T11 in the low gain mode, the supplemental current Isw is mirrored onto the drains of transistors T9b and T10b and then provided as supplemental current to load resistors RLp and RLn. As a result, the AC signal gain from inputs INp and INn to outputs OUTp and OUTn can be switched through gain control input GCNTL without affecting the common mode DC output voltage. This allows mixer 200 to be coupled directly to following circuit stages while providing variable gain.

In the embodiment shown in FIG. 2, mixer 200 has two gain steps. In alternative embodiments, the mixer circuit can be extended to include more than two gain steps. This can be accomplished by adding additional switched gain transistors similar to transistors T9b and T10b. Each switched gain transistor (or array of parallel transistors) would be selectively coupled in parallel with a respective one of the output transistors T9a and T10a through an appropriate switching protocol. In each embodiment, the correct supplemental current would need to be switched into or out of the load resistors in order to maintain a substantially constant DC current through the load resistors at all gain settings.

Numerous other modifications to the circuit shown in FIG. 2 are also possible. For example, mixer 200 can be implemented with a complementary circuit having an input stage formed of PMOS transistors, a current mirror formed of NMOS transistors coupled to the negative voltage supply rail and the load resistors being coupled to the positive voltage supply.

In another alternative embodiment, the supplemental current mirror is replaced with a bias voltage. Switch outputs 223 and 233 are coupled to bias voltage terminal 250 rather than to supplemental reference transistor T11 and supplemental current source 226. Supplemental reference transistor T11 and supplemental current source 226 are eliminated. In this embodiment, it is preferable that the bias voltage, Vbias, on terminal 250 varies with temperature and process variations in the PMOS transistors T7–T10 in order to present an accurate supplemental DC current to load resistors RLp and RLn.

Although the present invention has been described with reference to preferred embodiments, workers skilled in the art will recognize that changes may be made in form and detail without departing from the spirit and scope of the invention. For example, a Gilbert mixer is simply one type input mixer stage that can be used with the present invention. Other types of input mixer stages can also be used. Also, similar approaches can be adopted in other integrated circuit technologies, such as bi-polar and BiCMOS technologies with suitable switches. The mixer can be used at various frequencies, such as "RF", "IF" and low frequencies. In addition, the mixer can be used for other applications such as multiplication and variable gain control. The term "current source" used in the specification and the claims is intended to include both a current source and a current sink. Similarly, the term "transistor" can include a single transistor or an array of transistors coupled together in parallel. The term "coupled" can include a direct connection or a connection through one or more intermediate components.

What is claimed is:

1. An mixer comprising:
a signal differential input;
a local oscillator differential input;
a gain control input;
a signal differential output;
a stepped signal gain from the signal differential input to the signal differential output which is variable from a first gain to a second, different gain by the gain control input; and
a substantially constant DC common mode output bias voltage at the signal differential output which is substantially the same when the stepped signal gain is at the first and second gains.

2. The mixer of claim 1 and further comprising:
first and second output transistors which drive respective first and second output terminals of the signal differential output;
first and second load resistors coupled in series with the first and second output transistors, respectively; and
first and second switched gain transistors which are coupled in series with the first and second load resistors, respectively, and are selectively coupled in parallel with the first and second output transistors, respectively, based on the gain control input.

3. The mixer of claim 2 and further comprising:
an input stage having current-steering control terminals which are coupled to the signal differential input and the local oscillator differential input and having first and second current outputs, wherein the first and second current outputs are mirrored into the first and second output transistors, respectively.

4. The mixer of claim 3 and further comprising:
a supplemental output current source; and
a supplemental current mirror having a supplemental reference transistor coupled in series with the supplemental output current source and having first And second output legs that are selectively formed by the first and second switched gain transistors, respectively, therein the first and second output legs are in series with the first and second load resistors, respectively.

5. The mixer of claim 4 wherein:
the first switched gain transistor is selectively coupled in parallel with the first output transistor or in the first output leg of the supplemental current mirror; and
the second switched gain transistor is selectively coupled in parallel with the second output transistor or in the second output leg of the supplemental current mirror.

6. The mixer of claim 5 and further comprising:
first and second switches which are controlled by the gain control input;
wherein the first switched gain transistor has a current control terminal which is selectively coupled to either a current control terminal of the first output transistor or to a gate of the supplemental reference transistor through the first switch; and
wherein the second switched gain transistor has a current control terminal which is selectively coupled to either a current control terminal of the second output transistor or to the gate of the supplemental reference transistor through the second switch.

7. The mixer of claim 2 and further comprising:
a bias voltage terminal;
first and second switches which are controlled by the gain control input;
wherein the first switched gain transistor has a current control terminal which is selectively coupled to either a current control terminal of the first output transistor or to the bias voltage terminal through the first switch; and
wherein the second switched gain transistor has a current control terminal which is selectively coupled to either a current control terminal of the second output transistor or to the bias voltage terminal through the second switch.

8. The mixer of claim 2 and further comprising:
a first plurality of switched gain transistors, each selectively coupled in parallel with the first output transistor to provide a respective gain step to the mixer; and
a second plurality of switched gain transistors, each selectively coupled in parallel with the second output transistor to provide a, respective gain step to the mixer.

9. The mixer of claim 3, wherein the input stage comprises a Gilbert mixer.

10. The mixer of claim 3 wherein the input stage comprises:
an input tail current source;
a first differential transconductor which is coupled in series with the input tail current source, has first and second control inputs coupled to the signal differential input, and first and second output legs;
a second differential transconductor which is coupled in series with the first output leg of the first differential transconductor, has first and second control inputs coupled to the local oscillator differential input, and first and second output legs which are coupled to the first and second current outputs of the input stage; and
a third differential transconductor which is coupled in series with the second output leg of the first differential transconductor, has first and second control inputs cross-coupled to the local oscillator differential input, and first and second output legs which are cross-coupled to the first and second current outputs of the input stage.

11. The mixer of claim 3 and further comprising:

a first current mirror having a first reference transistor coupled in series with the first current output of the input stage and an output leg which comprises the first output transistor; and a second current mirror having a second reference transistor coupled in series with the second current output of the input stage and an output leg which comprises the second output transistor.

12. An mixer comprising:

a differential voltage signal input;

a differential voltage local oscillator input;

a gain control input;

a differential voltage signal output;

first and second load resistors which are coupled to respective terminals of the differential voltage signal output;

means for mixing the differential voltage signal input with the differential voltage local oscillator input to produce a mixed differential current;

means for mirroring the mixed differential current into the first and second load resistors; and means for switching current gain in the means for mirroring as a function of the gain control input while maintaining common-mode DC current in the first and second load. resistors substantially constant.

13. The mixer of claim 12 wherein;

the means for mirroring comprises first and second output transistors, which are coupled in series with the first and second load resistors, respectively; and the means for switching current gain comprises first and second switched gain transistors which are coupled in series with the first and second load resistors, respectively, and are selectively coupled in parallel with the first and second output transistors, respectively, as a function of the gain control input.

14. The mixer of claim 13 wherein the means for switching current gain further comprises:

a supplemental output current source; and a supplemental current mirror having a supplemental reference transistor coupled in series with the supplemental output current source and having first and second output legs that are selectively formed by the first and second switched gain transistors, respectively, wherein the first and second output legs are in series with the first and second load resistors, respectively.

15. The mixer of claim 14 wherein:

the first switched gain transistor is selectively coupled in parallel with the first output transistor or in the first output leg of the supplemental current mirror; and the second switched gain transistor is selectively coupled in parallel with the second output transistor or in the second output leg of the supplemental current mirror.

16. The mixer of claim 15 wherein the means for switching current gain further comprises:

first and second switches which are controlled by the gain control input;

wherein the first switched gain transistor has a current control terminal which is selectively coupled to either a current control terminal of the first output transistor or to a gate of the supplemental reference transistor through the first switch; and wherein the second switched gain transistor has a current control terminal which is selectively coupled to either a current control terminal of the second output transistor or to the gate of the supplemental reference transistor through the second switch.

17. The mixer of claim 13 the means for switching current gain further comprises:

a bias voltage terminal;

first and second switches which are controlled by the gain control input;

wherein the first switched gain transistor has a current control terminal which is selectively coupled to either a current control terminal of the first output transistor or to the bias voltage terminal through the first switch; and wherein the second switched gain transistor has a current control terminal which is selectively coupled to either a current control terminal of the second output transistor or to the bias voltage terminal through the second switch.

18. The mixer of claim 13 wherein the means for switching current gain further comprises:

a first plurality of switched gain transistors, each selectively coupled in parallel with the first output transistor to provide a respective gain step to the mixer; and a second plurality of switched gain transistors, each selectively coupled in parallel with the second output transistor to provide a respective gain step to the mixer.

19. The mixer of claim 12 wherein the means for mixing comprises a Gilbert mixer.

20. A method of mixing a differential input signal with a differential local oscillator signal with gain, the method comprising:

mixing a differential input signal with a differential local oscillator signal to produce a mixed differential current;

mirroring the mixed differential current into first- and second load resistors through a current mirror; and selectively switching signal gain through the current mirror while maintaining a common-mode DC current in the load resistors substantially constant.

\* \* \* \* \*